MULTIMODULE SEMICONDUCTOR RECTIFIER DEVICES

Filed Sept. 15, 1961 6 Sheets-Sheet 1

Inventors
Rudolf Benda and
Heinz Schneider

MULTIMODULE SEMICONDUCTOR RECTIFIER DEVICES

Filed Sept. 15, 1961 6 Sheets-Sheet 2

Inventors

Rudolf Benda and Harry Schneider

Inventors

Rudolf Benda and
Heinz Schneider

MULTIMODULE SEMICONDUCTOR RECTIFIER DEVICES

Filed Sept. 15, 1961

Inventors

Rudolf Benda and Heinz Schneider

Inventors

Rudolf Benda and
Heinz Schneider

May 3, 1966 R. BENDA ETAL 3,249,827

MULTIMODULE SEMICONDUCTOR RECTIFIER DEVICES

Filed Sept. 15, 1961 6 Sheets-Sheet 6

Inventors

Rudolf Benda and
Heinz Schneider

United States Patent Office 3,249,827

Patented May 3, 1966

3,249,827

MULTIMODULE SEMICONDUCTOR RECTIFIER DEVICES

Rudolf Benda, Berlin-Siemensstadt, and Heinz Schneider, Berlin-Haselhorst, Germany, assignors to Siemens-Schuckertwerke Aktiengesellschaft, Berlin-Siemensstadt, Germany, a corporation of Germany Filed Sept. 15, 1961, Ser. No. 138,360
Claims priority, application Germany, Sept. 16, 1960, S 70,385
4 Claims. (Cl. 317—234)

Our invention relates to the production of semiconductor rectifier devices that are composed of stacks or columns of individual pellets, particularly of miniature size for use with printed circuits.

Rectifier devices of such small sizes, for example selenium rectifiers, are being used to an ever growing extent. Numerous types of rectifier devices are needed differing from each other with respect to the size of the pellets as well as the particular rectifier circuit. For example, half-wave circuits, two phase and multi-phase bridge networks, midpoint connected circuits, voltage doubler circuits, anti-parallel circuits and similar circuit modifications are being used. While the production of the rectifier pellets, particularly those of the selenium type, has been automated to a great extent, this has been feasible only to a limited degree with respect to the assembling of the pellets, terminals, and other components that are needed to form a complete rectifier device. The difficulties of further automation have been due to the above-mentioned need for a comprehensive manufacturing program comprising a variety of power ratings as well as different types of circuitry, thus involving production series of relatively small numbers of devices.

It is an object of our invention, therefore, to improve the manufacture of semiconductor rectifier devices from individual rectifier pellets toward a much higher degree of mechanical or automatic production than heretofore economically feasible.

To this end, and in accordance with a feature of our invention, the pellets and the connecting or terminal sheet members are subassembled, for example automatically, into mechanically independent elementary systems whose design electrically corresponds to a doubler circuit and which are all alike with respect to construction and number of components, except that some of the pellets and connecting sheet members may be substituted by metallic "blind" plates, and that rectifier devices requiring a greater number of pellets and a different circuitry are formed by insertion of several such elementary systems into a common housing.

The fundamental concept of the invention resides in the fact that a semi-finished product of uniform design can be produced which, on the one hand, is applicable as a standard component or module for all usual rectifier circuits and which, on the other hand, already consumes and combines in itself the major portion of the working steps or cycles required for the production of rectifier devices having more complicated circuits or a higher number of pellets. Giving such a standard elemental system or module an electrical design of the voltage-doubler type is particularly advantageous, because such doubler circuits, each having a mid-connection and two outer connections, lend themselves in a simple manner to being assembled to single-phase and midpoint circuits as well as to rectifier bridge networks and doubler circuits with a higher number of rectifier pellets. In accordance with the particular requirements, individual pellets or connecting members within the elementary system can be substituted by simple, metallic "blind" plates. It is only essential that the elementary system in each case possess the same number of structural parts so that the same manufacturing jigs can be used or that the machinery used for automatic production will always perform the same number of operating steps or cycles. This makes it possible to manufacture rectifier devices of the greatest variety of types by producing large series of elementary systems, thus affording an economical automation of the production and hence a considerable reduction in manufacturing cost.

The method according to the invention also affords that the elementary systems, prior to being inserted into a housing common to several such systems, can be electrically tested and, if necessary, can be electrically further processed, for example, subjected to a further forming treatment. Such pre-testing is applicable because each elementary system already constitutes an operative entity in mechanical and electrical respects.

An electrical connection of the elementary systems among themselves is preferably effected by spot welding. For this purpose, particular extension or flags are preferably provided at the outermost connecting sheet members of the voltage-doubler arrangement. After the systems are inserted into their housing, they are preferably embedded in a suitable casting resin. The housing may be designed as a flat cup of metal or insulating material. For devices that must dissipate heat losses of the rectifier elements by heat conductance to a chassis, support or other heat sink, the use of a metal housing is preferable. For self-supporting rectifier devices, particularly for use with printed circuits, cup-shaped housings of insulating material are mainly applicable.

The invention will be further described with reference to the accompanying drawings, in which.

Figure 1:
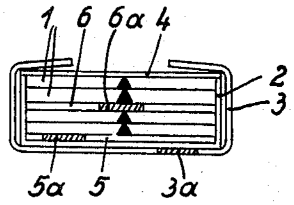
FIG. 1 is a partly sectional side elevation of an elementary rectifier system in voltage-doubler connection according to the invention.

The elementary rectifier system shown in FIG. 1 is provided with four selenium pellets or tablets each denoted by 1. The pellets 1 are placed one on top of the other within a metal clamp 3 lined with an insulating foil 2. The insulating foil 2 covers the bottom and two lateral surfaces of the pellet stack. Placed upon the stack is a spring 4 which is pressed against the top pellet by the bent-over upper ends of the clamp 3 and which in this manner provides for the necessary contact pressure between the individual members of the stack. The clamp 3 is in conducting connection with the uppermost pellet 1 through the spring 4 and serves also as an electric connecting member. For this purpose the clamp 3 is provided with a terminal flag or leg 3*a*. Another contact sheet 5 is located at the bottom side of the stack of pellets 1. The sheet 5 is provided with a connecting flag 5*a*. Located in the middle of the stack is another contact sheet 6 with a connecting flag 6*a*.

Figure 2:
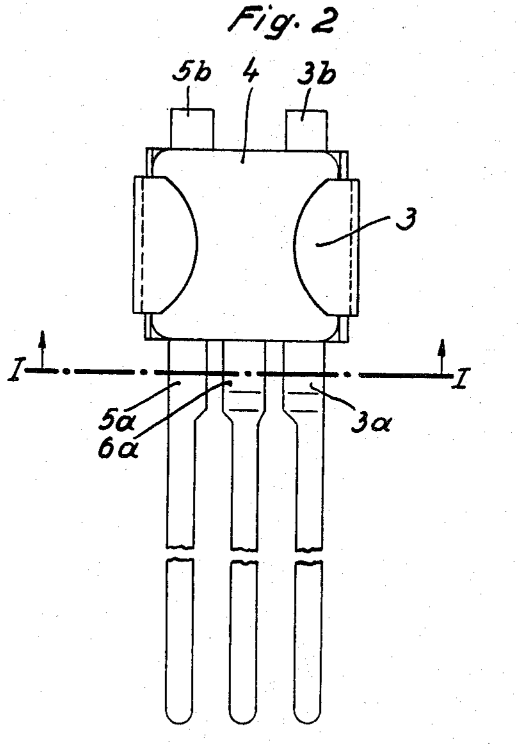
FIG. 2 is a top view of the system of FIG. 1 (the section in FIG. 1 being taken along the line I—I)
Figure 3:
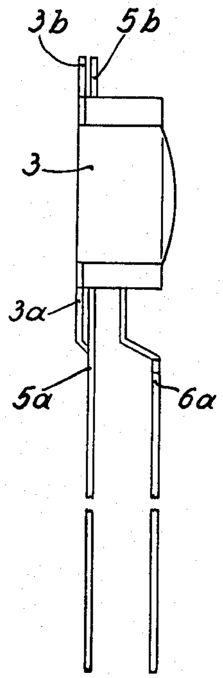
FIG. 3 is a side view of the system FIG. 1.

As apparent from FIGS. 2 and 3, the clamp 3 and the contact sheet 5 are provided with short extension stubs 3*b* and 5*b* on the side opposite to the connecting flags 3*a* and 5*a*. The stubs 3*b* and 5*b* serve for connecting several of such elementary systems among themselves so that they form the modules of a more composite rectifier device, as will be more fully explained hereinbelow.

It is of advantage to dimension the distance between the connecting flags 3*a*, 5*a* and 6*a* in accordance with the standards employed for printed circuits. For example when the German standards for printed circuits (DIN 40801 of February 1959) are being employed, the spacing between these connecting flags is chosen preferably in accordance with these standards, that is, such distance is made equal to 2.5 mm. or an integral multiple thereof. For this purpose, and as shown in FIG. 3, the flags 3*a* and 6*a* are correspondingly bent and offset at 3′ and 6′. The width *w* of the connecting flags is preferably about 1 mm., since the diameter of the bores in the carrier plates of printed circuits is 1.3 mm. under the above-mentioned German standards.

The above-described system of FIGS. 1 to 3 constitutes in itself a complete rectifier device with a total of four individual rectifier pellets, a positive lead constituted by the connecting flag 3*a*, a negative lead constituted by the flag 5*a* and a midpoint or tap lead constituted by the connecting flag 6*a*. As explained, such a doubler system is employed as an elementary system or modular unit for composing a great variety of more complex rectifier devices in accordance with the assembling method of our invention as will be set forth presently.

Figure 4:
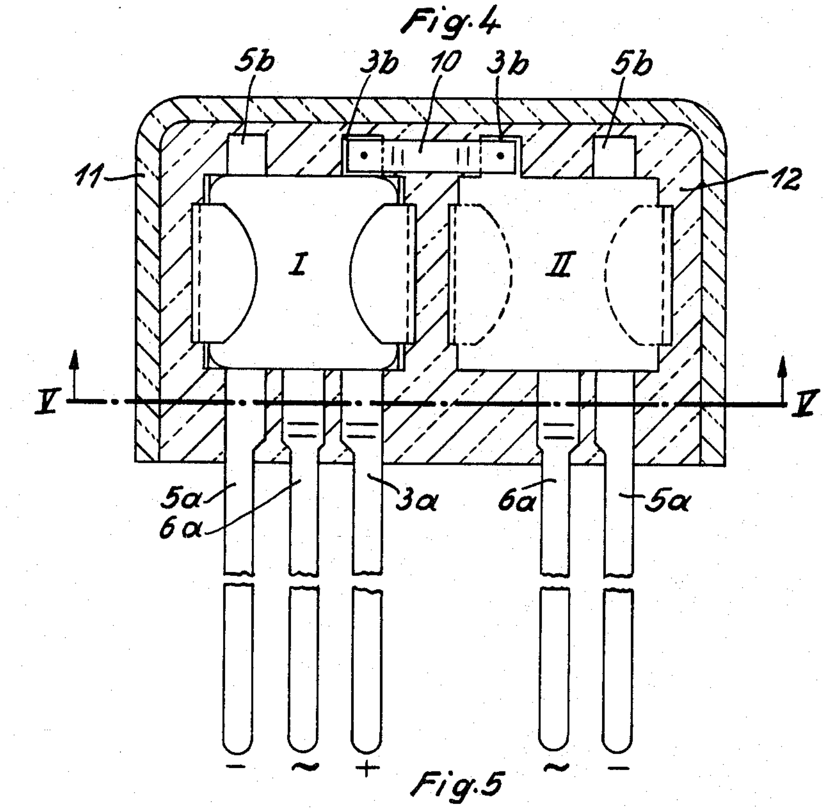
FIG. 4 shows in section a complete rectifier device which combines two elementary systems of FIGS. 1 to 3 within a common housing.
Figure 5:
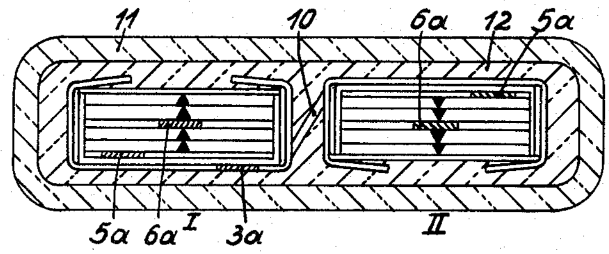
FIG. 5 is a section along the line V—V of FIG. 4.
Figure 6:
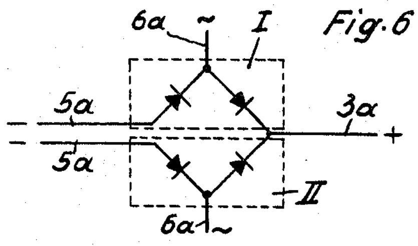
FIG. 6 is a circuit diagram of the rectifier device shown in FIGS. 4 and 5.

According to FIGS. 4 and 5 two elementary systems I and II, each corresponding to the one described above with reference to FIGS. 1 to 3, are inserted into a narrow cup-shaped housing 11, and the remaining interspaces are then filled with a casting resin 12, for example an epoxy resin or polyester resin. The two modules I and II are placed in inverted position relative to each other so that the respective stubs 3*b* are close to each other, and the two stubs are connected with each other by a metal tape or strip 10. In this manner, a so-called "open" bridge network is obtained with a single positive lead 3*a*, two alternating-current leads 6*a* and two negative leads 5*a*, according to the circuit diagram shown in FIG. 6. The distance of the two modules I and II from each other is preferably so chosen that the distance of all five connecting flags is equal to a multiple of the standardized length, namely 2.5 mm. in the numerical example given above.

Figure 7:
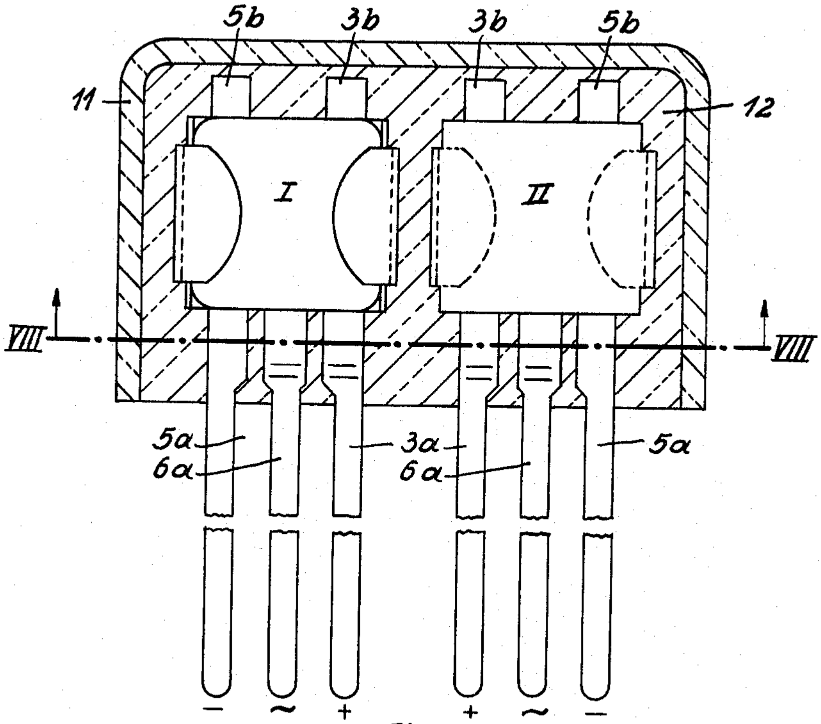
FIG. 7 is a sectional view of another rectifier device composed of elementary systems of the invention as shown in FIGS. 1 to 3.
Figure 8:
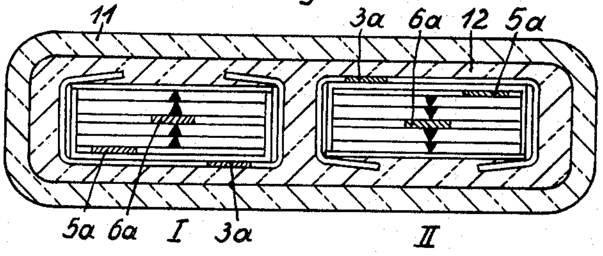
FIG. 8 is a section along the line VIII—VIII of FIG. 7.

In a rectifier device intended for printed circuits, the electric connection between the two elementary systems within the housing, established by the strip 10, may be dispensed with, because printed circuits make it readily possible to obtain the connection between the two plus connections of the elementary systems together with the other connections of the rectifier circuit without any components additional to the printed circuit itself. Such a device is shown in FIGS. 7 and 8. Here the modular system II is also provided with a plus connection 3*a* but the connecting strip 10 between the two modular systems is eliminated. The circuit diagram of the device according to FIGS. 7 and 8 is shown in FIG. 9.

Figure 9:
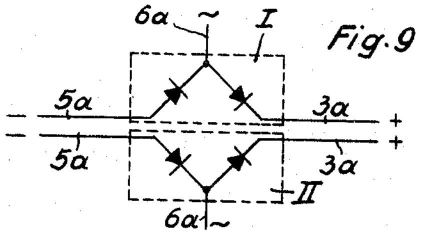
FIG. 9 is a circuit diagram of the rectifier device shown in FIGS. 7 and 8.
Figure 10:
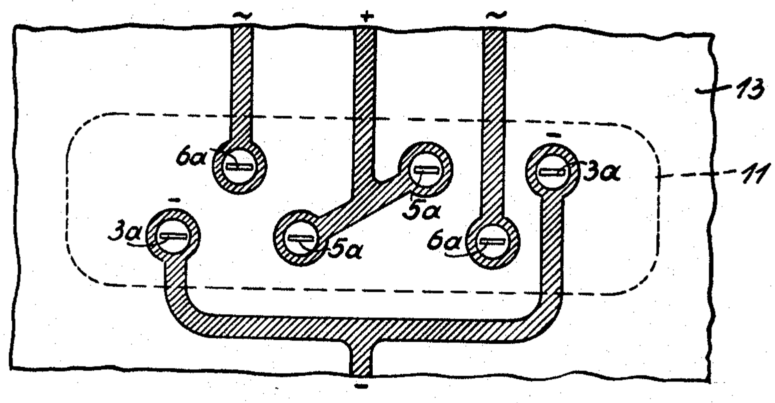
FIG. 10 shows part of an insulating base plate with a printed circuit for use with a rectifier device as shown in FIGS. 7 to 9.

The bridge network according to FIG. 9, which is still open at the plus and minus sides is completed when the rectifier device is inserted into a carrier plate with a printed circuit that comprises the necessary connecting leads. FIG. 10 shows the corresponding portion of such a connecting plate 14 viewed from its printed side. The contour of the rectifier housing behind the insulating plate 15 is indicated in FIG. 10 by a broken line 11. The metallic connecting leads printed upon the insulating plate 13 are identified by diagonal hatching.

Figure 11:
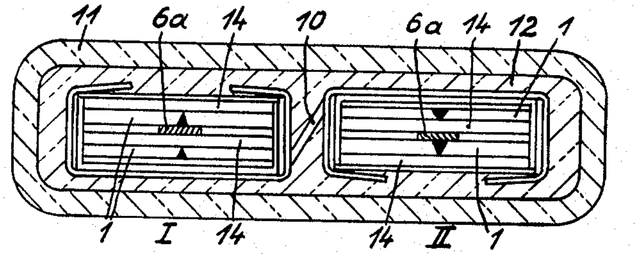
FIGS. 11 and 12 show respective sectional views of rectifier devices generally similar to that of FIGS. 7 to 9 but containing respectively different numbers of rectifier pellets.

The bridge-type rectifier devices according to FIGS. 4, 5 and 7, 8 comprise two rectifier pellets in each branch of the bridge network. As apparent from FIG. 11, a bridge network with only one pellet or branch is obtained by inserting into the elementary system above and below the contact plate 6 only one rectifier pellet 1 and, in lieu of the eliminated second rectifier pellet, a blind plate 14 of the same thickness consisting of copper or aluminum. In this manner, the number and dimensions of the individual components that grow into each elementary system or module remain the same so that the modified elementary systems can be assembled and fastened together by the same jigs devices or production machinery without appreciable adaptation expedients.

Figure 12:
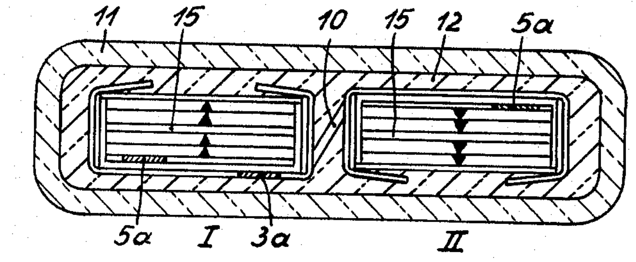
Figure 13:
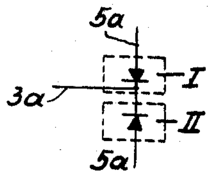
FIG. 13 is a circuit diagram corresponding to the rectifier device of FIG. 12.
Figure 14:
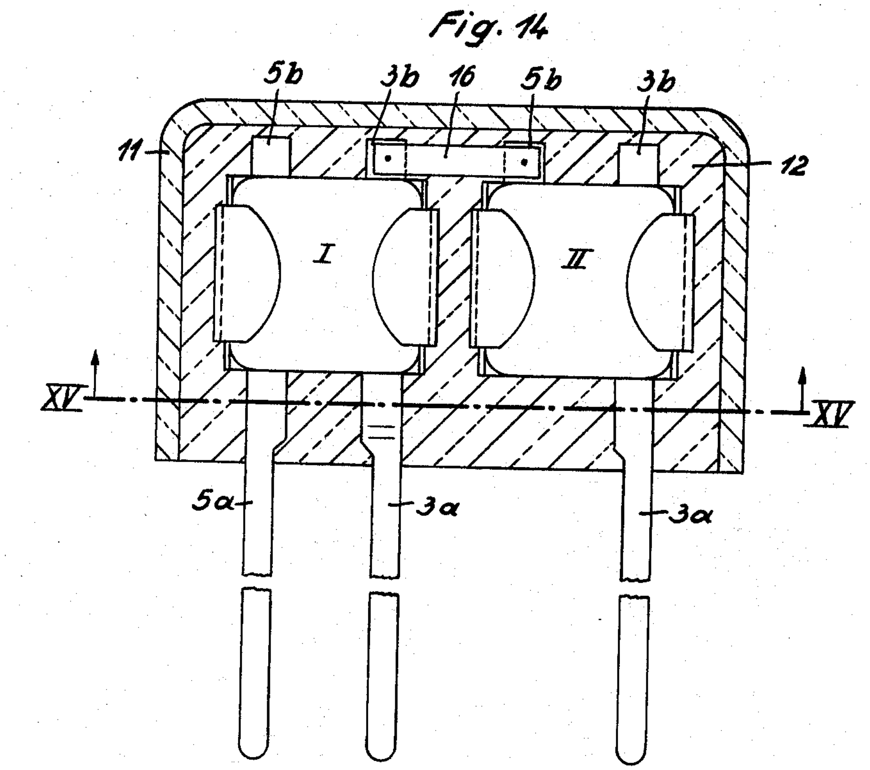
FIG. 14 is a sectional view of still another rectifier device composed of elementary systems as shown in FIGS. 1 to 3.
Figure 15:
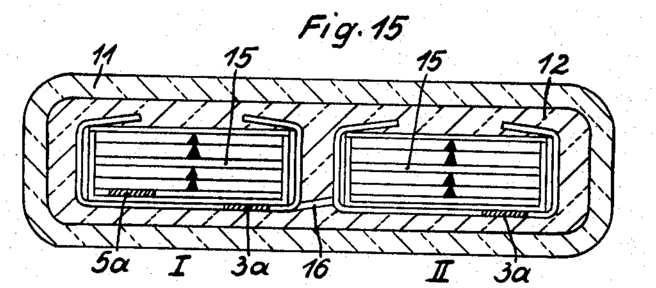
FIG. 15 is a section along the line XV—XV of FIG. 14.
Figure 16:
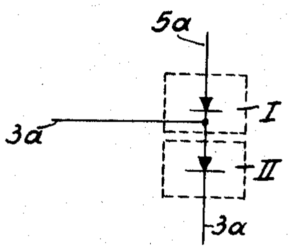
FIG. 16 is a circuit diagram of the device shown in FIGS. 14 and 15.

If a midpoint connection is to be provided on an assembly composed of two elementary systems, the same arrangement is chosen as in FIGS. 4 and 5 except that the middle connecting flags 6*a* of the respective two elementary systems are omitted. Such a rectifier device is illustrated in FIG. 12. In lieu of the connecting plates 6 which, according to FIGS. 1 to 3, are provided with connecting flags 6*a*, the device shown in FIG. 12 is provided with simple rectangular blind plates 15 without any connecting flags. In this manner the fundamental design of the elementary system remains preserved. The circuit diagram corresponding to FIG. 12 is illustrated in FIG. 13. A doubler connection with 2 x 4 rectifier pellets can be obtained by connecting two elementary systems in series. Such a rectifier device is shown in FIGS. 14 and 15. In this case the elementary system II has the same position as the system I, in contrast to the inverted position shown in FIGS. 4 and 7; and the connecting stub 3*b* of system I is connected by a conductor strip 16 with the connecting stub 5*b* of system II. The middle connecting flags 6*a* of both systems are omitted. That is, the sheet members 6 which, according to FIGS. 1 to 3, are provided with respective flags 6*a*, are substituted by rectangular blind plates 15 without such flags. The circuit diagram of the doubler connection thus obtained is illustrated in FIG. 16. The circuit constitutes a one-way connection with a total of eight rectifier pellets, the connecting stub 3*b* of the modular component I being not used or omitted.

Figure 17:
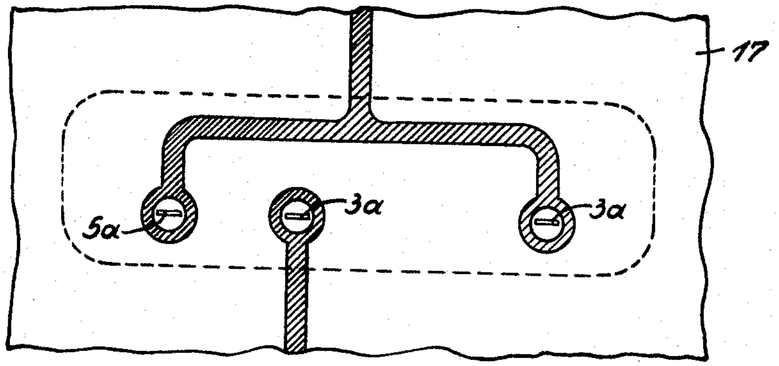
FIG. 17 shows part of an insulating plate with printed circuit applicable with a rectifier device, as shown in FIGS. 14 and 15.
Figure 18:
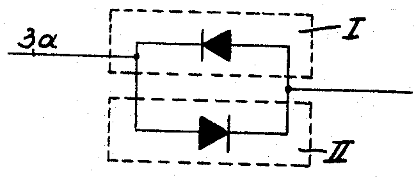
FIG. 18 is a modified circuit diagram of a rectifier device when mounted on a printed-circuit plate of FIG. 17.

The three external terminals of the rectifier device according to FIGS. 14 and 15 can also be so connected that an anti-parallel connection of the two elementary systems I and II will result. FIG. 17 shows a printed circuit on an insulating carrier plate 17 which meets this purpose, the illustration being otherwise similar to FIG. 10. The corresponding circuit diagram is shown in FIG. 18.

As explained in the foregoing elementary systems or recifier modules which, in principle, are designed in accordance with a type of doubler connection, afford composing all rectifier circuits that will occur in practice. Each elementary system is preferably given a desired maximum number of pellets which in the illustrated example is constituted by four such pellets. However, the number of pellets can be reduced, as desired, by substituting individual rectifier pellets by blind plates of conducting metal. Further, rectifier circuits with a greater number of rectifier pellets are obtained by combining more than two elementary systems, for example four such modules, with each other and mounting them in a common housing. However, in some cases it is of advantage, for rectifier devices with a greater number of rectifier pellets, to produce another type of an elementary system which from the outset contains more pellets, for example twenty rectifier pellets per module. In production, preferably automatic production of such elementary systems, the number of working steps or cycles can be reduced by combining several such pellets into a group and treating them as an entity. With elementary systems having a maximum of four or twenty pellets, it is possible, to build up a complete type series of rectifier devices for all customary rectifier circuits from about 12 to about 600 volt feeder voltage. The current-carrying capacity of the systems required in each particular case can be obtained by providing corresponding pellet or rectifier-plate sizes. However, for obtaining a higher load-carrying capacity, the size of the housing may also be increased in order to provide for larger heat dissipating surfaces for eliminating the heat losses. In each case, by far the dominant portion of the work to be done for assembling the rectifier devices is concentrated in the elementary systems or modules; and only a relatively small amount of residual work is required for thereafter combining the elementary systems within a common rectifier housing. The invention therefore affords a considerable reduction in cost of manufacture by permitting for a great variety of rectifier types the production of fundamentally similar elementary systems or composite modules with the aid of the same jigs or the like manufacturing devices or automatic machinery.

We claim:

1. A rectifier device, comprising a plurality of elementary rectifier system modules each having the same number of structural components, the structural components of each of said modules comprising a plurality of rectifier pellets and a plurality of electrically conductive connecting members and a modular housing for said pellets and connecting members, the pellets and connecting members of each of said modules being stacked to correspond to a determined electrical circuit with one of said connecting members being positioned intermediate said stack and two of said connecting members being positioned at opposite ends of said stack, said pellets having the same polarity orientation throughout each stack, the connecting members of each of said modules having terminal projections extending from the corresponding modular housing at opposite sides of each stack;

a common housing having a plurality of said modules positioned therein; and connecting means electrically connecting selected ones of the terminal projections at one side of different ones of said modules in said common housing to form a different determined electrical circuit, selected others of the terminal projections at the opposite side of different ones of said modules extending from said common housing.

2. A rectifier device as claimed in claim 1, further comprising blind plates replacing selected ones of the pellets of selected ones of said modules.

3. A rectifier device as claimed in claim 1, further comprising blind plates replacing selected ones of the connecting members of selected ones of said modules.

4. A rectifier device as claimed in claim 1, further comprising casting resin embedding said modules in said common housing.

References Cited by the Examiner

UNITED STATES PATENTS

| | | | |
|---|---|---|---|
| 2,788,474 | 4/1957 | Jackson | 317—234 |
| 2,791,731 | 5/1957 | Walker et al. | 317—234 |
| 2,999,963 | 9/1961 | Schmeider | 317—234 |
| 3,112,432 | 11/1963 | Martin et al. | 317—234 |

JOHN W. HUCKERT, *Primary Examiner.*

JAMES D. KALLAM, *Examiner.*

A. S. KATZ, J. D. CRAIG, *Assistant Examiners.*